US010110783B2

(12) United States Patent
Webster

(10) Patent No.: US 10,110,783 B2
(45) Date of Patent: Oct. 23, 2018

(54) IMAGE SENSOR PRECHARGE BOOST

(71) Applicant: OMNIVISION TECHNOLOGIES, INC., Santa Clara, CA (US)

(72) Inventor: Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/469,812

(22) Filed: Mar. 27, 2017

(65) Prior Publication Data

US 2018/0278810 A1  Sep. 27, 2018

(51) Int. Cl.
   *H04N 3/14*      (2006.01)
   *H04N 5/335*     (2011.01)
   *H04N 5/355*     (2011.01)
   *H03K 19/00*     (2006.01)

(52) U.S. Cl.
   CPC ....... *H04N 3/1568* (2013.01); *H03K 19/0027* (2013.01); *H04N 3/1506* (2013.01); *H04N 3/1518* (2013.01); *H04N 3/1525* (2013.01); *H04N 5/3559* (2013.01)

(58) Field of Classification Search
   CPC ...... H04N 5/335; H04N 5/378; H04N 5/3745; H04N 5/3741; H04N 5/363; H04N 5/374; H04N 5/361
   See application file for complete search history.

(56) References Cited

U.S. PATENT DOCUMENTS

| 8,294,077 | B2 | 10/2012 | Mao et al. | |
| 2005/0062867 | A1* | 3/2005 | Mabuchi | H04N 5/3559 348/308 |
| 2006/0119720 | A1* | 6/2006 | Hong | H01L 27/14609 348/308 |
| 2007/0147132 | A1* | 6/2007 | Lee | H04N 3/1568 365/185.23 |
| 2011/0036969 | A1* | 2/2011 | Ahn | H01L 27/14609 250/208.1 |
| 2012/0153123 | A1* | 6/2012 | Mao | H04N 5/35509 250/208.1 |
| 2014/0239430 | A1* | 8/2014 | Egawa | H01L 27/14806 257/432 |
| 2016/0165165 | A1* | 6/2016 | Chen | H04N 5/3741 348/308 |
| 2017/0287959 | A1* | 10/2017 | Kwag | H01L 27/14616 |

* cited by examiner

*Primary Examiner* — Kelly L Jerabek
(74) *Attorney, Agent, or Firm* — Christensen O'Connor Johnson Kindness PLLC

(57) ABSTRACT

Image sensors with precharge boost are disclosed herein. An example image sensor may include pixels that each include a photodiode to receive image light and produce image charge in response, a floating diffusion to receive the image charge, a transfer gate to couple the photodiode to the floating diffusion in response to a transfer control signal, a reset gate to couple a reset voltage to the floating diffusion in response to a reset control signal, and a boost capacitor coupled between the floating diffusion and a boost voltage source, wherein, during a precharge operation, the boost voltage is provided to the boost capacitor for a portion of time the transfer gate is enabled and while the reset gate is disabled.

18 Claims, 2 Drawing Sheets

IMAGE SENSOR PRECHARGE BOOST

TECHNICAL FIELD

This disclosure relates generally to image sensors, and in particular but not exclusively, relates to lag reduction, e.g., precharge boost, in an image sensor.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Noise in images captured by image sensor may manifest as white dots, for example, along with other noise patterns. The white dots may be caused by variation in barrier heights between pixels, and which may be due to electrons remaining in photodiodes of the pixels after precharge. The electrons may also introduce lag in the precharge operation and affect a full well capacity of the pixels. As such, it may be desirable to reduce white dot noise and the ancillary precharge lag and reduced full well capacity.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
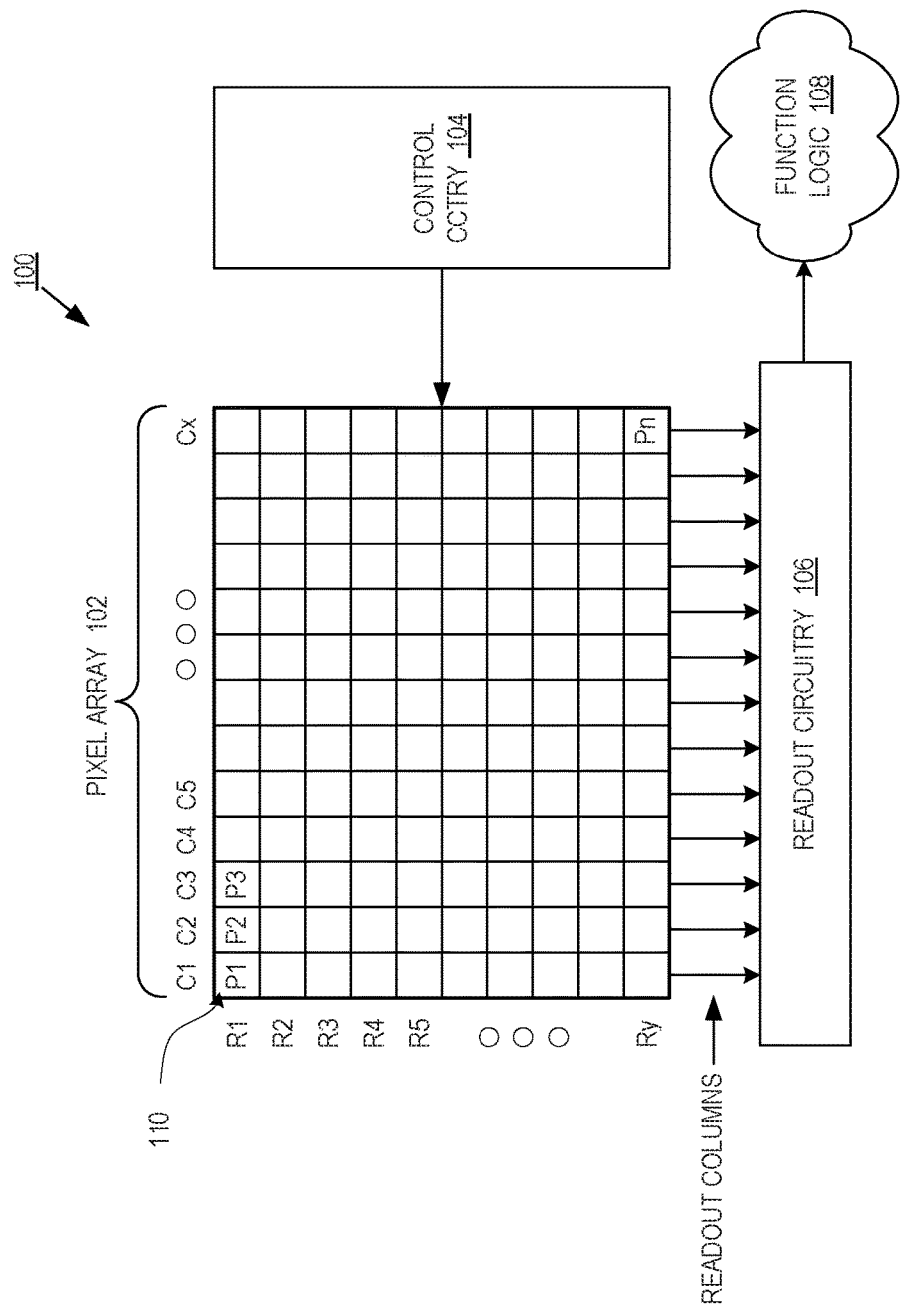
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for precharge boost of an image sensor are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 106, and function logic 108. In one example, pixel array 102 is a two-dimensional (2D) array of photodiodes, or image sensor pixels 110 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 106 and then transferred to function logic 108. Readout circuitry 106 may be coupled to readout image data from the plurality of photodiodes in pixel array 102. In various examples, readout circuitry 106 may include amplification circuitry, analog-to-digital (ADC) conversion circuitry, or otherwise. Function logic 108 may simply store the image data or even manipulate the image data by applying post image effects (e.g., crop, rotate, remove red eye, adjust brightness, adjust contrast, or otherwise). In one example, readout circuitry 106 may readout a row of image data at a time along readout column lines (illustrated) or may readout the image data using a variety of other techniques (not illustrated), such as a serial readout or a full parallel readout of all pixels simultaneously.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels 110 within pixel array 102 to simultaneously capture their respective image data during a single acquisition window. In another example, the shutter signal is a rolling shutter signal such that each row, column, or group of pixels is sequentially enabled during consecutive acquisition windows. In general, the present disclosure may be applied to any type of image sensors.

In one example, prior to the acquisition of the image data, e.g., integration, the pixels 110 of the pixel array 102 may be reset. During the reset and prior to integration, the photodiodes (PDs) and associated floating diffusions (FDs) of the pixels 110 may be precharged to drive the PDs and FDs to a reference voltage. The coupling of the reference voltage to the PDs and FDs may fully deplete those components of electrons to avoid introducing unwanted noise into an image. In some embodiments, the reference voltage may be the same for the PDs and the FDs, but in other embodiments, the PDs and FDs may be driven or reset to different reference voltages. The precharge voltage may additionally increase a full well capacity of the pixel so that more image charge may be incorporated into the image data. In some embodiments, the FD and the PD may be coupled to a boost voltage during the precharge operation. The boost voltage may increase a voltage on at least the FD, which may prevent the voltage on the FD from undesirable loss during a readout operation. The loss of voltage on the FD during readout may introduce lag into the acquisition of the image data by the imaging system 100, for example.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
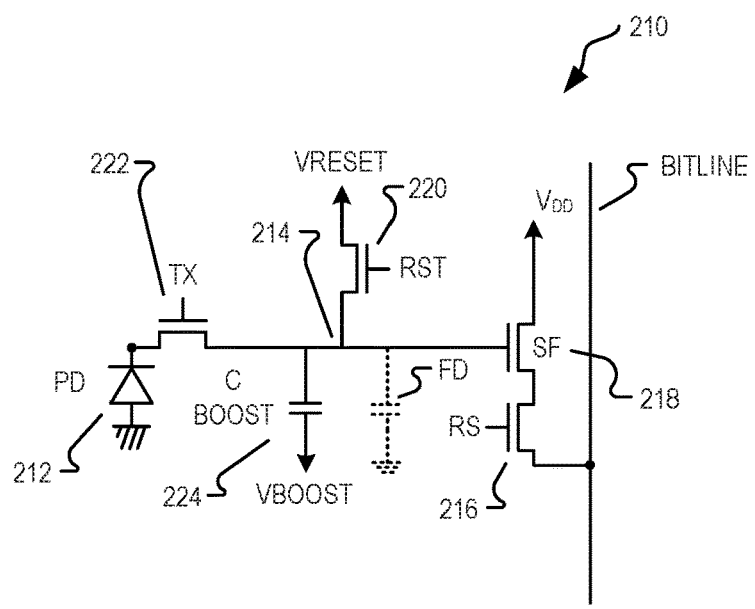
FIG. 2 is an example schematic of a pixel in accordance with an embodiment of the present disclosure.

FIG. 2 is an example schematic of a pixel 210 in accordance with an embodiment of the present disclosure. The pixel 210 may be but one example of a pixel 110 of the pixel array 102. The illustrated embodiment of the pixel 210 includes a PD 212, a transfer gate 222, an FD 214, a reset gate 220, boost capacitor CBOOST, a source follower (SF) transistor 218, a row select transistor 216. In some embodiments, the pixel 210 may be coupled to a bitline at least through the row select transistor 216. While only one PD 212 is shown in the pixel 210, multiple PDs 212 may be coupled to the FD 214. For example, up to four PDs 212 may be included in the pixel 210. However, the number of PDs 212 included in the pixel 210 is a non-limiting aspect of the present disclosure.

The PD 212 may be coupled between ground and to a terminal of the transfer gate 222. In response to image light, the PD 212 may generate image charge. The transfer gate 222 may be coupled to receive a transfer control signal TX on a gate terminal. The TX signal may be provided by control circuitry, such as control circuitry 104. The TX signal may enable/disable the transfer gate 222. When enabled, the transfer gate 222 may couple the PD 212 to the FD 214, and decouple them when disabled. Image charge form the PD 212 may be provided to the FD 214 when the transfer gate 222 is enabled, for example.

The FD 214 may be a node disposed in a silicon substrate capable of storing image charge transferred from the PD 212. In some embodiments, the FD 214 is a bulk capacitive well coupled to ground. The FD 214 may be coupled to the transfer gate 222, the reset gate 220, a gate terminal of the SF transistor 218, and the boost capacitor CBOOST. The reset gate 220 may be coupled to receive a reset signal RST on a gate terminal. The RST signal may couple/decouple the FD 214 to a reset voltage VRESET, and may be provided by control circuitry. In some embodiments, VRESET may be AVDD. In other embodiments, VRESET and AVDD may be different voltages. Examples for VRESET and AVDD include 3.3 or 3.6 volts for VRESET, and 2.8 volts for AVDD. In embodiments where VRESET and AVDD are the same, VRESET and AVDD may be 2.8 volts.

The boost capacitor CBOOST may be coupled between FD 214 and a voltage reference source. The voltage reference source may provide a reference voltage VBOOST. In some embodiments, VBOOST may be greater than VRESET and/or AVDD. In some embodiments, VBOOST may range from 0 to 2.8 volts, but may be as high as 3.6 volts in other embodiments. VBOOST may be coupled to or provided to CBOOST via control circuitry.

The SF 218 may be coupled between a second reference voltage, such as VDD, and the row select transistor 216. The row select transistor 216 may be coupled to receive a row select signal RS at a gate, which may couple SF 218 to the bitline. The RS signal may also be provided by control circuitry. Charge/voltage on FD 214 may turn on SF 218 a commensurate amount to provide a corresponding voltage to the bitline (when the row select transistor 216 is enabled). The corresponding voltage may be representative of the image charge on FD 214. In general, the SF 218 converts the image charge into the image data.

Figure 3:
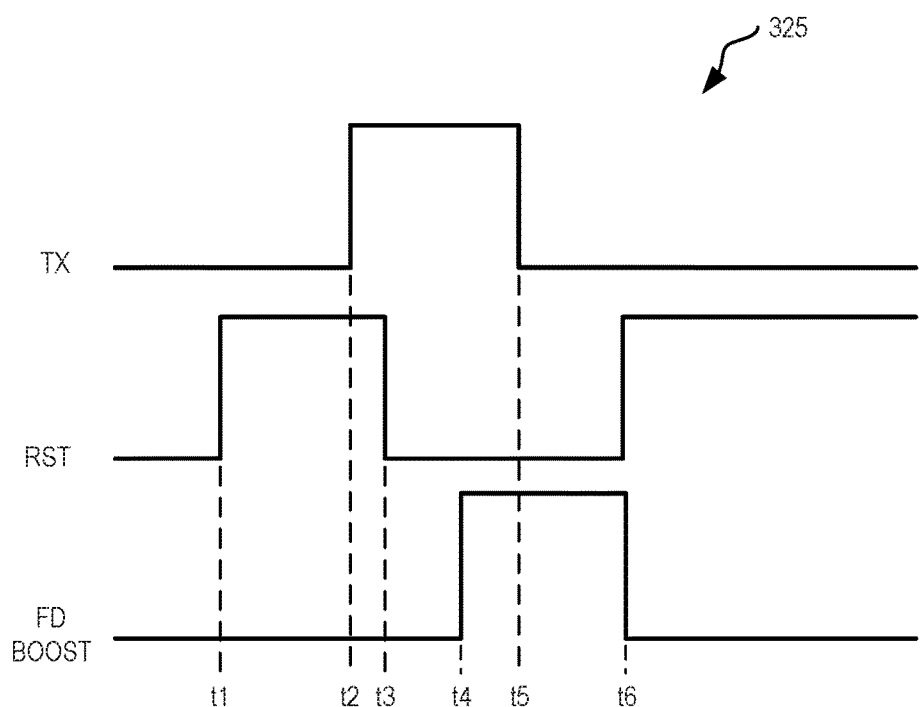
FIG. 3 is an example timing diagram in accordance with an embodiment of the present disclosure.

FIG. 3 is an example timing diagram 325 in accordance with an embodiment of the present disclosure. Timing diagram 325 may be used to illustrate an example operation of the pixel 210. The control signals TX, RST, and FD BOOST are shown in the timing diagram 325, and the changes in the signals represent logic or voltage changes. In some embodiments, control circuitry 104, for example, provides the control signals shown in timing diagram 325.

The timing diagram 325 shows a precharge operation of an imaging system, such as the imaging system 100, in which the pixels 110 of the pixel array 102 are precharged prior to a readout operation. The precharge operation may set the pixel to a baseline voltage/charge level so that the image data may represent the image light. The precharge operation may couple the FD 214 and the PD 212 to a reference voltage to remove any free electrons prior to a readout operation. The removal of the free electrons may drive the FD 212 and the PD 214 to the base voltage.

At time t1 the RST control signal transitions high. As a result, the reset transistor 220 is enabled, and FD 214 is coupled to the reset voltage VRESET. Coupling the FD 214 to VRESET increases the voltage of FD 214 to VRESET and also removes any free electrons that may be stored on the FD 214.

At time t2, the TX signal transitions high, which may result in the enablement of the transfer gate 222. Enabling the transfer gate 222 may couple the PD 212 to the FD 214. Additionally, since the reset gate 220 is still enabled, the PD 212 is coupled to VRESET. As a result, the PD 212 may be driven to a voltage of VRESET and any free electrons may be removed, e.g., charge on the PD 212 may be transferred to the voltage source providing VRESET. In some embodiments, the main charge transfer may occur on the rising edge of the TX signal. At time t3, the RST control signal transitions low resulting in the disablement of the reset gate 220. However, the TX signal is still high, which may result in the FD 214 and the PD 212 remaining coupled.

At time t4, the FD BOOST signal transitions high, which may result in VBOOST being capacitively coupled to the FD 214 via boost capacitor CBOOST. Accordingly, the FD 214 may be boosted by, e.g., increased by, the voltage VBOOST, and because the transfer gate 222 is still enabled PD 212 may likewise be boosted by VBOOST. The additional increase to FD 214 voltage by VBOOST, which may be around 0.2 volts or up to but limited to 1.2 volts in some embodiments, may reduce the time to fully precharge the PD 212 and the FD 214. Additionally, by boosting the voltage on at least FD 214, e.g., boosting FD 214 voltage by VBOOST, loss of potential on the FD 214 that may occur at readout may be limited or prevented. Without the application of the present VBOOST invention, FD 214 voltage would reduce due to the parasitic coupling between reset gate 220 and FD when reset gate 220 is turned off prior to readout. This voltage loss on FD 214 may be around 0.3V and may increase the lag of the image sensor.

At time t5, the TX signal transitions to low, which may result in disabling the transfer gate 222. However, the FD BOOST signal may still be high so that VBOOST remains capacitively coupled to FD 214. As such, the FD 214 may remain boosted to VRESET plus VBOOST even after the reset signal transitions low. At time t6, the RST signal may transition back to high and the FD BOOST signal may transition back to low. After time t6, the precharge operation may be complete and a readout operation may be subsequently performed.

In some embodiments, the RS signal may be in a high state during the precharge operation so that a baseline voltage on FD 214 may be readout via the bitline. This baseline voltage may be used to implement correlated double sampling by the imaging system 100, for example. After time t5, image charge may be generated by the PD 212 in response to image light. Subsequent to time t6, a readout of the image charge may occur.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel, comprising:
    a photodiode to receive image light and produce image charge in response;
    a floating diffusion to receive the image charge;
    a transfer gate to couple the photodiode to the floating diffusion in response to a transfer control signal;
    a reset gate to couple a reset voltage to the floating diffusion in response to a reset control signal; and
    a boost capacitor coupled between the floating diffusion and a boost voltage source, wherein, during a precharge operation, a boost voltage from the boost voltage source is provided to the boost capacitor for a portion of time the transfer gate is enabled and while the reset gate is disabled, and wherein, during the precharge operation after the portion of time, the boost voltage is decoupled from the floating diffusion while the reset gate is simultaneously enabled.

2. The image sensor pixel of claim 1, wherein the boost voltage is continued to be provided to the boost capacitor after the transfer gate is disabled, and while the reset gate is disabled.

3. The image sensor pixel of claim 1, wherein the reset gate is enabled prior to enabling the transfer gate.

4. The image sensor pixel of claim 3, wherein the reset gate is disabled after the transfer gate is enabled, but before the boost voltage is provided to the boost capacitor.

5. The image sensor pixel of claim 1, wherein the reset voltage is a high reference voltage.

6. The image sensor pixel of claim 1, wherein the boost voltage increases the reset voltage by around 0.2 volts.

7. An imaging system comprising:
    a pixel array including a plurality of pixels, wherein each pixel comprises:
        a photodiode to receive image light and produce image charge in response;
        a floating diffusion to receive the image charge;
        a transfer gate to couple the photodiode to the floating diffusion in response to a transfer control signal;
        a reset gate to couple a reset voltage to the floating diffusion in response to a reset control signal; and
        a boost capacitor coupled between the floating diffusion and a boost voltage source; and
    control circuitry coupled to control the pixel array and at least provide the transfer and reset control signals,
    wherein, during a precharge operation, the control circuitry causes a boost voltage from the boost voltage source to be provided to the boost capacitor for a portion of time the transfer gate is enabled in response to the transfer control signal provided by the control circuitry, and wherein, during the precharge operation after the portion of time, the control circuitry causes the boost voltage to be decoupled from the floating diffusion while the reset gate is simultaneously enabled in response to the reset control signal provided by the control circuitry.

8. The imaging system of claim 7, wherein the control circuity provides the reset control signal prior to providing the transfer control signal, and ceases providing the reset control signal before causing the boost voltage to be provided to the boost capacitor.

9. The imaging system of claim 7, wherein each pixel further comprises a source follower transistor having a gate terminal coupled to the floating diffusion, and a source and drain terminal coupled to a reference voltage and a bitline, respectively, wherein the source follower converts the image charge to image data.

10. The imaging system of claim 9, further comprising readout circuitry coupled to receive the image data from each pixel of the pixel array via a respective bitline.

11. The imaging system of claim 7, wherein the control circuitry causes the boost voltage to cease being provided to the boost capacitor before or concurrently with providing the reset control signal.

12. The imaging system of claim 11, wherein the reset voltage is a high reference voltage.

13. The imaging system of claim 7, wherein the boost voltage increases the reset voltage by or greater than 0.2 volts.

14. The imaging system of claim 7, wherein, during the precharge operation, the control circuitry causes the boost voltage to be provided to the boost capacitor after the transfer gate is disabled.

15. The imaging system of claim 7, wherein, during the precharge operation, the control circuitry causes the reset gate to be enabled for a portion of time the transfer gate is enabled, but prior to the boost voltage is provided to the boost capacitor.

16. A method for precharging an image sensor, the method comprising:
    enabling a reset gate to couple a reset voltage to a floating diffusion of an image sensor pixel;
    enabling a transfer gate to couple a photodiode of the image sensor pixel to the floating diffusion;
    disabling the reset gate to decouple the reset voltage from the floating diffusion;

capacitively coupling a boost voltage to the floating diffusion, wherein the boost voltage increases a precharge voltage of the floating diffusion;

decoupling the boost voltage from the floating diffusion; and enabling the reset gate, wherein decoupling the boost voltage from the floating diffusion and enabling the reset gate occur simultaneously.

17. The method of claim 16, further comprising:

disabling the transfer gate while capacitively coupling the boost voltage to the floating diffusion.

18. The method of claim 16, wherein the boost voltage increases the reset voltage by greater than 0.1 volts.

* * * * *